United States Patent [19]

Murakami

[11] Patent Number: 4,819,045
[45] Date of Patent: Apr. 4, 1989

[54] MOS TRANSISTOR FOR WITHSTANDING A HIGH VOLTAGE

[75] Inventor: Koichi Murakami, Yokosuka, Japan

[73] Assignee: Nissan Motor Co. Ltd., Kanagawa, Japan

[21] Appl. No.: 97,273

[22] Filed: Sep. 17, 1987

Related U.S. Application Data

[63] Continuation of Ser. No. 824,571, Jan. 23, 1986, abandoned.

[30] Foreign Application Priority Data

Jan. 25, 1985 [JP] Japan .................................. 60-11024

[51] Int. Cl.⁴ ........................................... H01L 29/78
[52] U.S. Cl. ..................... 357/23.4; 357/20; 357/23.8; 357/23.9; 357/23.11; 357/52; 357/55
[58] Field of Search ..................... 357/23.4, 23.8, 23.9, 357/23.11, 20, 52, 55

[56] References Cited

U.S. PATENT DOCUMENTS

| 4,334,235 | 6/1982 | Nishizawa | 357/23.4 |
| 4,422,089 | 12/1983 | Vaes et al. | 357/23.4 |
| 4,561,168 | 12/1985 | Pitzer et al. | 357/23.4 |

Primary Examiner—Edward J. Wojciechowicz
Attorney, Agent, or Firm—Foley & Lardner, Schwartz, Jeffery, Schwaab, Mack, Blumenthal & Evans

[57] ABSTRACT

An improved lateral MOS transistor with higher withstand voltage is shown. The transistor is provided with a drift region (19) formed so as to surround a drain region (7) thereof. The curved sections (7b) of the drain region (7) are joined with the drift region (19) whose impurity density is chosen lower than that of the drain region (19).

2 Claims, 5 Drawing Sheets

MOS TRANSISTOR FOR WITHSTANDING A HIGH VOLTAGE

This application is a continuation of application Ser. No. 824,571 filed Jan. 23, 1986, now abandoned.

BACKGROUND OF THE INVENTION

The present invention relates to a lateral type MOS transistor for withstanding a high voltage.

A lateral MOS transistor comprises a source region, a channel region and a drain region, arranged respectively in the top portion of a semiconductor substrate. In the device current flows in the channel region between the source and drain regions which are naturally formed with curved portions where breakdown is likely to occur with somewhat low breakdown voltage. Prior to the invention some attempts have been carried out in order to obtain high breakdown voltage. However, in these attempts, new processes must be added to an ordinary fabricating process.

SUMMARY OF THE INVENTION

An object of the invention is to provide a MOS transistor for withstanding a high voltage.

Another object of the invention is to provide a MOS transistor for withstanding a high voltage which can be fabricated by process steps used for an ordinary MOS transistor, without additional process steps.

Briefly described, these and other advantages and objects are accomplished by providing of a drift region around the drain region, the drift region having an impurity concentration lower than that of the drain region.

DESCRIPTION OF THE PREFERRED EMBODIMENTS

To facilitate an understanding of the present invention, a brief reference will be made with respect to the prior art.

Figure 1:
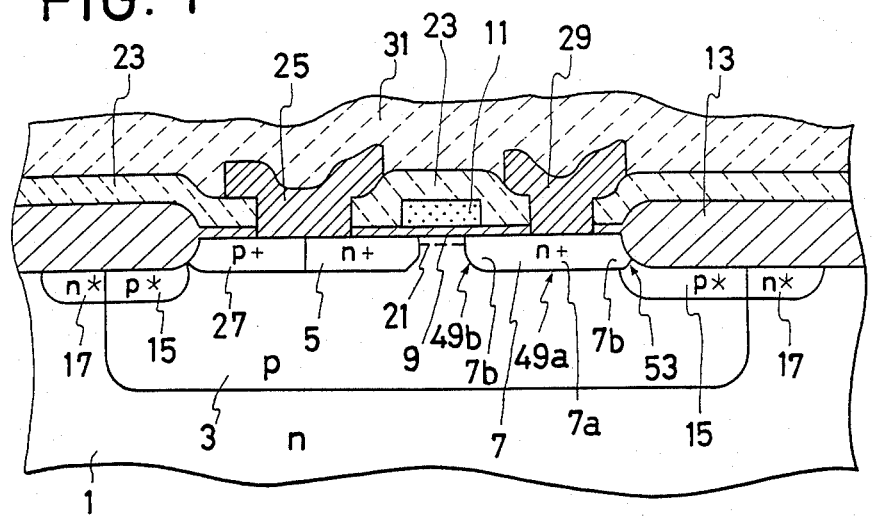
FIG. 1 is a cross-sectional structure diagram of an ordinary MOS transistor.

An example of the cross-sectional structure of a general transverse MOS transistor is illustrated in FIG. 1.

In the example in which an N channel MOS transistor is formed by the CMOS process, a source region 5 and a drain region 7 are formed in the top portion of a P well 3. When a voltage is applied to a gate electrode 11, a channel region 21 is formed beneath an oxide gate film 9 to connect electrically the source region 5 to the drain region 7. Further, a thick oxide film 13 that is formed by the LOCOS method on the top layer of an N substrate 1 and the P well 3 surrounds the circumference of the MOS transistor. Moreover, in order to prevent the formation of parasitic channels underneath the thick oxide film 13, a parasitic N channel stopping region 15 and a parasitic P channel stopping region 17 are formed to increase the surface concentrations of the P well 3 and the N substrate 1.

The withstand voltage of the MOS transistor formed in the above manner is determined by the breakdown voltage with respect to the planar section 49a of the n+−p junction between the planar section 7a of the drain region 7 and the P well 3, the curved section 49a of the n+−p junction between the curved section 7b of the drain region 7 and the P well 3, or the n+−P* junction section 53 between the curved section 7b of the drain region 7 and the parasitic N channel stopping region 15.

In an ordinary case, the n+ impurity concentration of the drain region 7 is less than about $1 \times 10^{20}/cm^3$ and its diffusion depth is about 1 μm, the P impurity concentration of the P well 3 is less than about $1 \times 10^{16}/cm^3$, and the P impurity concentration of the parasitic N channel stopping region 15 is about $2 \sim 3 \times 10^{16}/cm^3$.

Namely, the n+−P junctions 49a and 49b between the drain region 7 and the P well 3 may be approximated by a step junction. At the planar section 49a, the breakdown voltage is on the order of 70 V, but at the curved section 49b the breakdown voltage is on the order of 25 to 30 V under the influence of an increase in the electric field intensity due to charge concentration. Further, on the gate electrode 11 side, the breakdown voltage is slightly lower than the above value due to the influence of the electric field of the electrode 11 and the electric field of the fixed ions and others in an oxide gate film 9. Moreover, in the n+−p* juncture 53 between the curved section 7b of the drain region 7 and the parasitic N channel stopping region 15, the breakdown voltage is on the order of 20–25 V because of the influence of the charge concentration and of the fact that the impurity concentration of the parasitic N channel stopping region 15 is higher than that of the P well 3. Accordingly, the withstand voltage of a MOS transistor formed by the ordinary CMOS process is determined by the breakdown voltages at the curved sections 49b 53 of the drain juncture which is a low value of 20–25 V, being difficult to attain a high withstand voltage.

For this reason, a method such as the one disclosed in "Integrated High and Low Voltage CMOS Technology," pp. 77–82 in "IEDM" published in 1982 by "International Electron Device Meeting" has been adopted to obtain a high withstand voltage by separating the gate electrode from the drain region to give an offset structure, and by eliminating the curved portion to relax the concentration of electric field slightly by doping ions in the offset section that extends from the drain region to the section directly underneath the gate electrode, thereby forming a drift region.

However, this method has the problem in that the process becomes complicated because it is necessary to add the ion injection process for forming the drift region.

The invention will next be described in what follows by referring to FIGS. 2 and 3(A) to (M).

Figure 2:
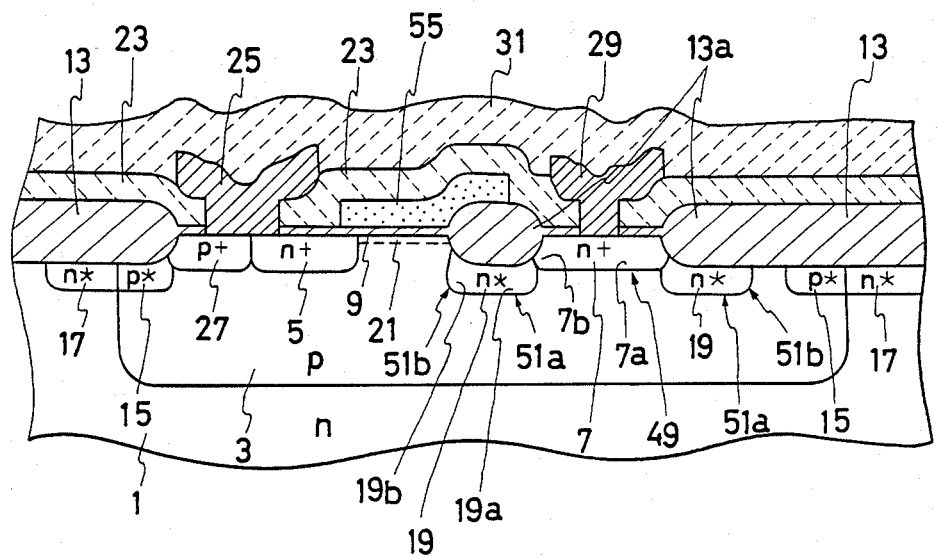
FIG. 2 is a cross-sectional structure diagram in an embodiment of the MOS transistor for withstanding a high voltage in accordance with the present invention.

FIG. 2 is a cross-sectional view that illustrates the structure of a MOS transistor with large withstand voltage in accordance with the present invention.

In the top portion of a P well 3 formed in an N substrate 1, there are formed a source region 5 and a drain region 7, and between the source region 5 and the drain region 7 a polysilicon gate electrode 55 is formed on the P well 3 through a thin oxide gate film 9.

In addition, a thick oxide film 13 is formed by the LOCOS method on the top layer of the N substrate 1 and the P well 3, and surrounds the circumference of the MOS transistor. The elements separated from each other by forming a parasitic N channel stopping region 15 and a parasitic P channel stopping region 17 on the bottom side of the thick oxide film 13 which surrounds the circumference of the drain region 7. A portion 13a of the thick oxide film 13 surrounds the drain region 7. A drift region 19 is formed on the bottom side of the portion 13a and has an impurity concentration lower than that of the drain region 7. The drift region 19 is joined to the curved sections 7b of the drain region 7 and is connected to a channel region 21 which is situated below the oxide gate film 9. Moreover, the gate electrode 55 partially covers the left portion on the gate electrode 55 side of the portion 13a of the thick oxide film 13 that surrounds the drain region 7.

When a voltage is applied to the gate electrode 55 in this structure, a channel region 21 is formed below the oxide gate film 9, and an electric current flows from the drain region 7 to the source region 5 via the drift region 19 and the channel region 21.

Moreover, analogous to the ordinary MOS transistor, the surfaces of the gate electrode 55 and the thick oxide film 13 are covered with an intermediate insulation film 23. On which an aluminum-deposited source electrode 25 is formed and connected to the source region 5 and a P well contact region 27, and similarly, an aluminum-deposited drain electrode 29 is connected to the drain region 7. Furthermore, the entire exterior surface of the MOS transistor with high withstand voltage is covered with a protective passivation film 31.

The MOS transistor with high withstand voltage has a structure which is different from that of the ordinary MOS transistor, but can be formed by the same process as the one used for the ordinary MOS transistor. This will now be described by referring to FIG. 3.

FIGS. 3(A) to 3(M) illustrate process flow charts for forming an ordinary N channel MOS transistor, an ordinary P channel MOS transistor, and an N channel MOS transistor with high withstand voltage in the present embodiment, by means of the standard polysilicon gate CMOS process.

By referring to FIGS. 3(A) to 3(M), each process will be described as follows.

(A) Phosphorus ions with the density on the order of $10^{12}$ particles/cm$^2$ are implanted on the entire surface of the N substrate 1 in order to adjust the threshold voltage of the P channel MOS transistor.

(B) Boron ions with the density less than $10^{13}$ particles/cm$^2$ are implanted on the specified portions of the surface in order to form the P wells 3.

(C) The P wells 3 are formed by diffusing the phosphorus and boron ions implanted in the above processes (A) and (B), respectively. Also, a thin oxide film 33 is formed to cover the entire surfaces of the P wells 3.

(D) After an Si$_3$N$_4$ film 35 has been grown on the oxide film 33 by CVD method, Si$_3$N$_4$ film is removed from the portions where the thick oxide film 13 is to be formed.

(E) In the portions from which Si$_3$N$_4$ film is removed, boron ions of the order of $10^{13}$ particles/cm$^2$ are implanted with masks m to the portions 15' where the parasitic N channel stopping regions 15 are to be formed in the P well 3, in order to increase the surface concentration.

(F) In the portions from which Si$_3$N$_4$ film is removed, phosphorus ions of the order of $10^{12}$ particles/cm$^2$ are implanted with masks m to the portions 17' and 19' where the parasitic P channel stopping regions 17 and the drift region 19 aforementioned, respectively, are to be formed, in order to increase the surface concentration.

(G) The thick oxide film 13 is formed by LOCOS oxidation with the Si$_3$N$_4$ film as a mask. At the same time, the boron and phosphorus ions implanted in the processes (E) and (F), respectively, are diffused to form, beneath the thick oxide film 13, the parasitic N channel stopping regions 15, the parasitic P channel stopping regions 17, and the drift region 19 of the MOS transistor with large withstand voltage.

(H) After removing the Si$_3$N$_4$ film 35 and the oxide film 33 therebelow, an oxide gate film 9 is formed.

(I) After growing a polysilicon film on the oxide gate film 9 by CVD method, the gate electrode 111 for ordinary MOS transistor and the gate electrode 11 for MOS transistor with large withstand voltage are formed by selectively removing the polysilicon film.

(J) Borons are deposited with masks m to a high concentration with BBr$_3$ or by ion implantation in the portions 27', 37' and 39' where the P well contact region 27 of N channel MOS transistor, the source region 37 and the drain region 39 of the P channel MOS transistor, respectively, are to be formed. In this connection the masks m cover the gate electrodes 11, 55 on the P wells.

(K) The portions 5', 7', and 41' where the source region 5 and the drain region 7 of the N channel MOS transistor, and the N substrate contact region 41 of the P channel MOS transistor, respectively, are to be formed, are deposited with phosphorus to a high concentration by POCl$_3$ or ion implantation with masks m. In this connection the mask m covers the gate electrode 11 on the N substrate.

(L) After growing an intermediate insulating film 23 by the CVD method, borons and phosphori that are deposited to a high concentration by the processes (J) and (K), respectively, are diffused to form the source region 5, the drain region 7, and the P well contact region 27 of the N channel MOS transistor, and the source region 37, the drain region 39, and the N substrate contact region 41 of the P channel MOS transistor. Contact holes 43 are formed by etching.

(M) The source electrode 25 and the drain electrode 29, and the source electrode 45 and the drain electrode 47, of the N channel and the P channel MOS transistors, respectively, are formed by aluminum vapor deposition and patterning. Finally, a passivation film 31 is formed.

Figure 3A:
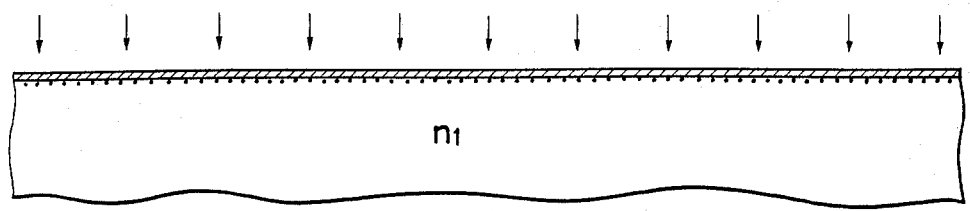
FIGS. 3(A) through 3(M) show a series of flow charts for illustrating the formation process of the MOS transistor for withstanding a high voltage.
Figure 3B:
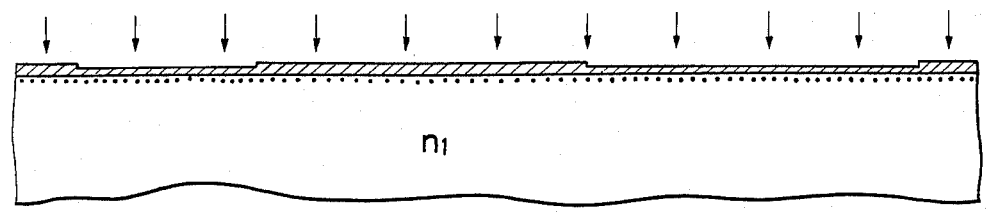
Figure 3C:
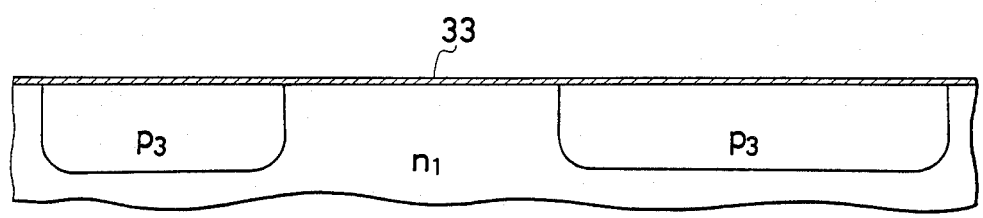
Figure 3D:
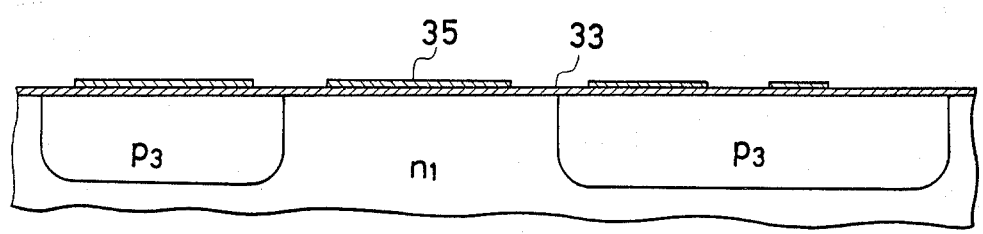
Figure 3E:
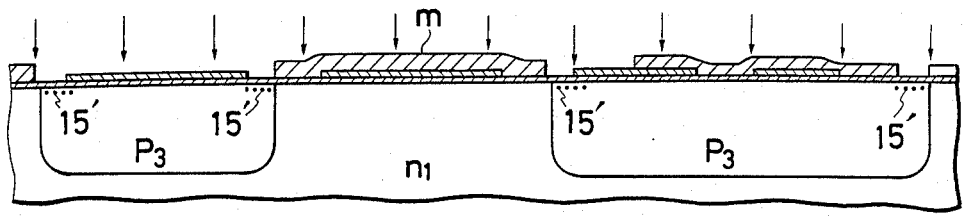
Figure 3F:
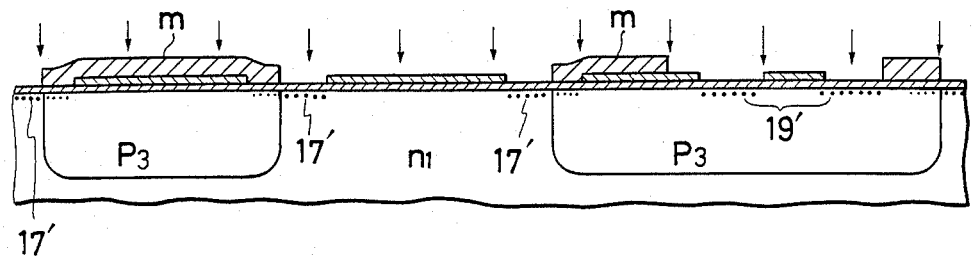
Figure 3G:
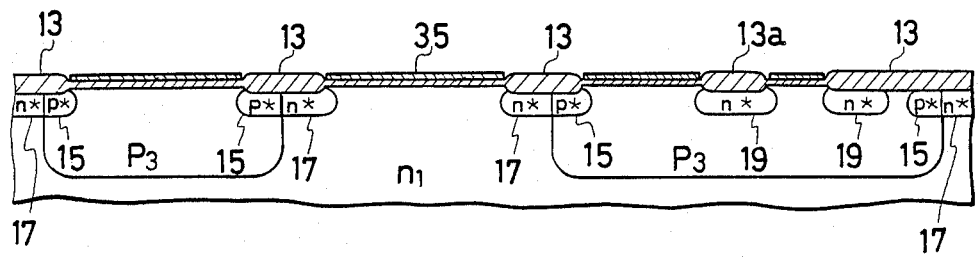
Figure 3H:
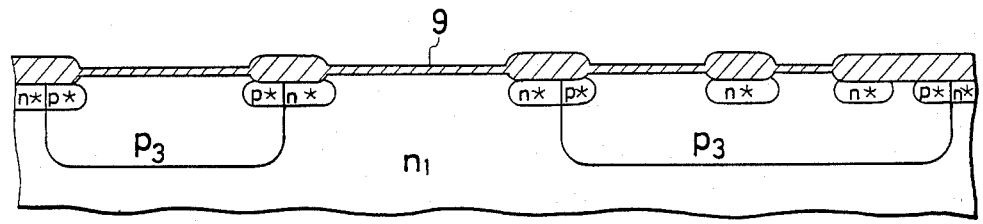
Figure 3I:
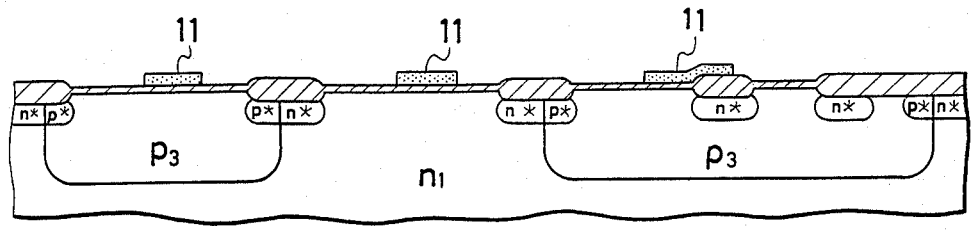
Figure 3J:
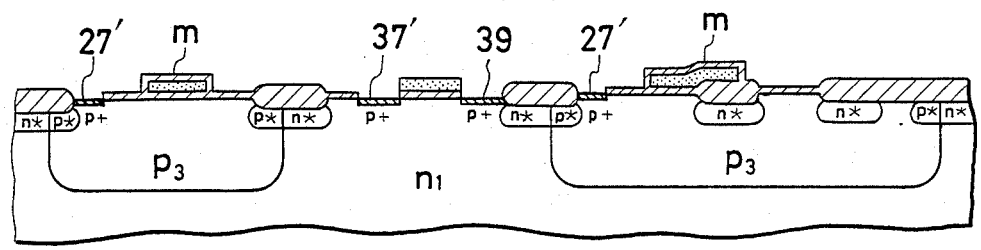
Figure 3K:
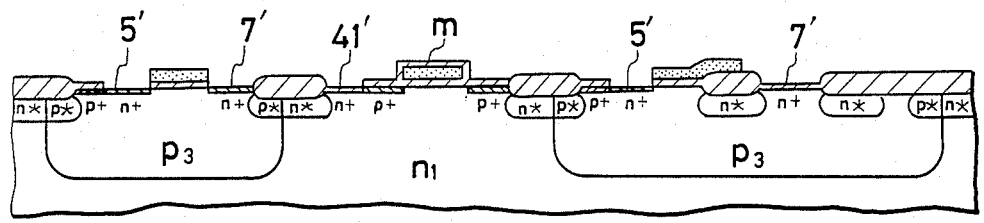
Figure 3L:
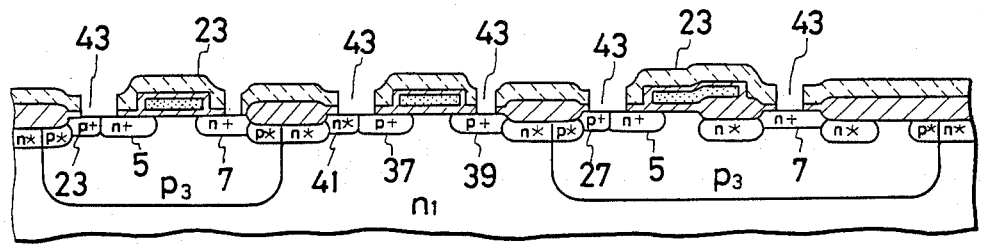
Figure 3M:
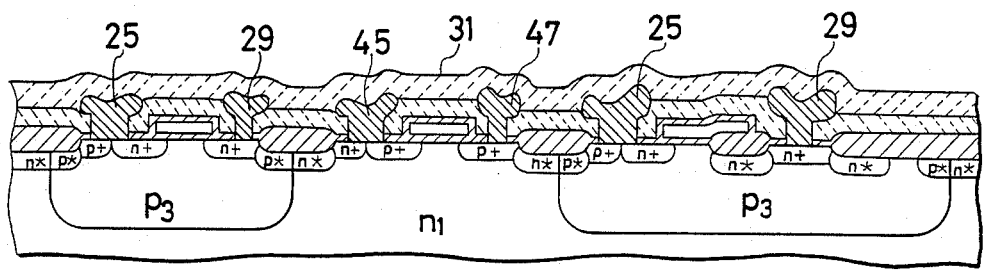

In this way, there can be formed simultaneously, from the left to the right of FIG. 3(M), an ordinary N channel MOS transistor, an ordinary P channel MOS transistor, and an N channel MOS transistor with large withstand voltage, without adding any additional new process to the ordinary CMOS processes or modifying the conditions for these processes.

The withstand voltage of the N channel MOS transistor with large withstand voltage will now be described next.

In the MOS transistor with large withstand voltage, the curved section 7b of the drain region 7 joins the drift region 19, and only the planar section 7a of the drain region 7 joins the P well 3, as shown in FIG. 1. Consequently, the withstand voltage of the MOS transistor with large withstand voltage will be determined by the breakdown voltage of the planer section 49 of the $^+-p$ junction between the planar section 7a of the drain region 7 and the P well region 3, the planar section 51a of the n*$-$P junction between the planar section 19a of the drift region 19 and the P well 3, or the curved section 51b of the n*−P junction between the curved section 19b of the drift section 19 and the P well 3. Here, n* means n−.

As mentioned earlier, the P impurity concentration of the P well 3 is about $1 \times 10^{16}/cm^3$, and the n* impurity concentration and the diffusion depth of the drift region 19 are about $2-3 \times 10^{16}/cm^3$ and 1 μm, respectivey. Accordingly, the n*p junctions 51a and 51b between the drift region 19 and the P well 3 are graded junctions, and the breakdown voltages for the planar section 51a and the curved section 51b are both larger than about 70 V. Further, the breakdown voltage of the planar section 49 of the $n^+$−p junction between the planar section 7a of the drain region 7 and the P well 3 is about 70 V as was mentioned before.

Therefore, the withstand voltage of the MOS transistor thus obtained is about 70 V. In other words, a highly voltage resistant MOS transistor with withstand voltage of 70 V can be formed by the same processes as the ones used for obtaining the ordinary MOS transistor with withstand voltage of about twenty volts.

It is noted that the above description which is made in conjunction with the N channel MOS transistor will apply similarly also to the P channel MOS transistor.

What is claimed is:

1. A MOS transistor comprising:

a well region of a first conductivity type formed in a semiconductor substrate;

a drain region formed in the well region to form a substantially flat junction with said well region, said drain region having a periphery with a curved portion and having a conductivity type opposite to the first conductivity type;

an oxide film coverng the drain region and the well region, said oxide film having a thinner portion located on a main portion of the drain region and expanding into a thicker portion partially covering the curved portion of the periphery of the drain region; and a drift region formed in the well region under the thicker portion of the oxide film to form a junction with the well region and having the same conductivity type as the drain region and having an impurity concentration lower than the drain region, said drift region partially surrounding the drain region at the curved portion of the periphery of the drain region and forming a junction with the curved portion of the periphery of the drain region to cover said curved portion, such that the junction between the well region and the drain region is substantially flat.

2. A MOS transistor as claimed in claim 1, wherein the first conductivity type is P and the conductivity type of the drain region and the drift region is N.

* * * * *